(12) United States Patent
Tanobe et al.

(10) Patent No.: US 11,631,506 B2
(45) Date of Patent: Apr. 18, 2023

(54) HIGH-FREQUENCY LINE CONNECTION STRUCTURE

(71) Applicant: Nippon Telegraph and Telephone Corporation, Tokyo (JP)

(72) Inventors: Hiromasa Tanobe, Tokyo (JP); Satoshi Tsunashima, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 337 days.

(21) Appl. No.: 17/252,646

(22) PCT Filed: May 27, 2019

(86) PCT No.: PCT/JP2019/020905
§ 371 (c)(1),
(2) Date: Dec. 15, 2020

(87) PCT Pub. No.: WO2019/244567
PCT Pub. Date: Dec. 26, 2019

(65) Prior Publication Data
US 2021/0210255 A1 Jul. 8, 2021

(30) Foreign Application Priority Data

Jun. 22, 2018 (JP) .............................. JP2018-118624

(51) Int. Cl.
*H01B 11/18* (2006.01)
*H01P 3/06* (2006.01)
*H01P 5/08* (2006.01)

(52) U.S. Cl.
CPC ............ *H01B 11/1808* (2013.01); *H01P 3/06* (2013.01); *H01P 5/085* (2013.01)

(58) Field of Classification Search
CPC ......... H01B 11/1808; H01P 3/06; H01P 5/085
See application file for complete search history.

(56) References Cited

U.S. PATENT DOCUMENTS

| 5,508,666 A | * | 4/1996 | Nguyen | .................. H01P 5/085 333/260 |
| 2004/0239454 A1 | * | 12/2004 | Dove | ..................... H01P 5/085 333/245 |

FOREIGN PATENT DOCUMENTS

JP          2009231796 A       10/2009

* cited by examiner

*Primary Examiner* — Samuel S Outten
(74) *Attorney, Agent, or Firm* — Slater Matsil, LLP

(57) ABSTRACT

A high-frequency line connection structure connects a coaxial line and a planar line. The high-frequency line connection structure includes a conductive base that is formed into a planar shape having a length that matches a length of the planar line along a lengthwise direction of a substrate, where the planar line is disposed on a surface of the conductive base, and a protrusion structure provided in a region, on the surface of the conductive base, adjacent to the coaxial line, the protrusion structure protruding from the surface of the conductive base, where the protrusion structure is in contact with a side surface of a region along the lengthwise direction of the substrate, where a ground conductive film with a smaller width out of a pair of ground conductive films of the planar line, is formed.

12 Claims, 7 Drawing Sheets

HIGH-FREQUENCY LINE CONNECTION STRUCTURE

CROSS-REFERENCE TO RELATED APPLICATIONS

This application is a national phase entry of PCT Application No. PCT/JP2019/020905, filed on May 27, 2019, which claims priority to Japanese Application No. 2018-118624, filed on Jun. 22, 2018, which applications are hereby incorporated herein by reference.

TECHNICAL FIELD

The present invention relates to a high-frequency line connection structure, and more particularly, to a technique of connecting a coaxial line and a planar line.

BACKGROUND

In recent years, in the field of optoelectronics, a high-frequency interface constituting an optoelectronic component is required to have low reflection characteristics and a low insertion loss over a wide frequency range. The structure of such a high-frequency interface adopts a mode of using a lead pin and a flexible printed circuit, but may, in some cases, use a coaxial interface.

Particularly, electronic components and optical module components having a 1 mm interface with band characteristics at 100 GHz or higher are expected to be used as key components for next-generation optical communication at 1 Tbps and beyond, and are being developed in and outside Japan.

Various components are disposed on a plane inside an electronic component or an optical module component as described above, and a high-frequency line that electrically connects the various components is generally fabricated on an insulating dielectric substrate. Furthermore, the shape of such a high-frequency line is often a bent/curved shape so that components mounted at different positions are connected.

The 1 mm interface has a coaxial line structure including an inner conductor and a cylindrical ground, which is clearly different from the structure of the high-frequency line that is fabricated on the dielectric substrate described above.

Because of such a different in the structures, there is a demand for a new connection mechanism for a high-frequency line, where, in a case of a high-frequency line that is fabricated on a dielectric substrate and that is mechanically and electrically connected to a coaxial line, a size of the dielectric substrate where the high-frequency line is formed is reduced, and low return loss characteristics and a low insertion loss with respect to high-frequency characteristics are achieved at a connection part.

For example, Patent Literature 1 discloses a high-frequency line connection structure that connects a coaxial line and a coplanar line as a planar line. With the high-frequency line connection structure disclosed in Patent Literature 1, a pair of ground conductive films with equal width is formed on respective sides of a strip-shaped signal line that is formed on a substrate of the coplanar line.

Figure 5A:
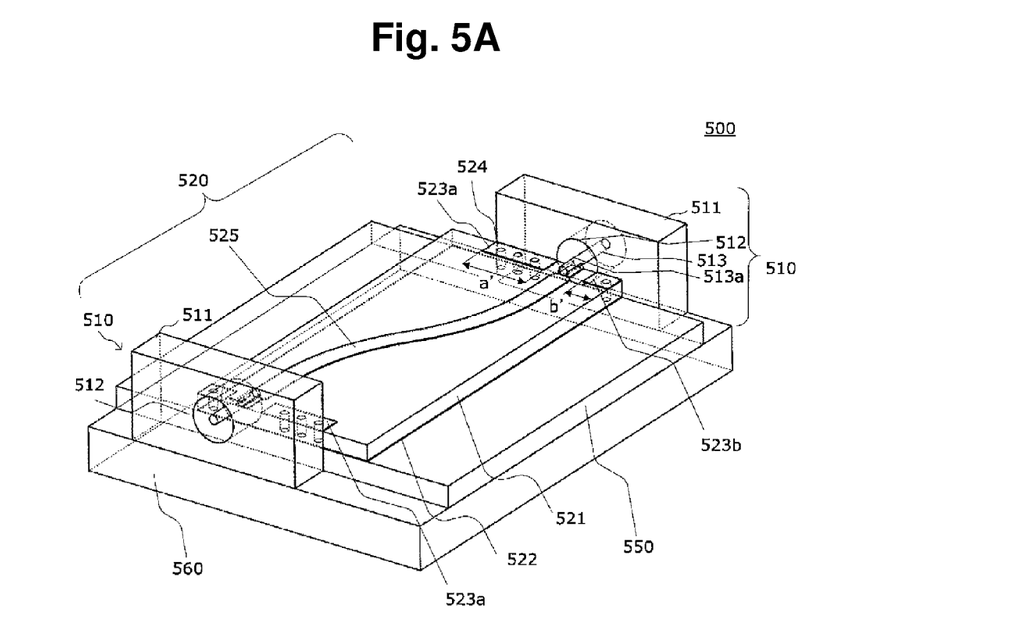
FIG. 5A is a perspective view of a conventional high-frequency line connection structure.
Figure 5B:
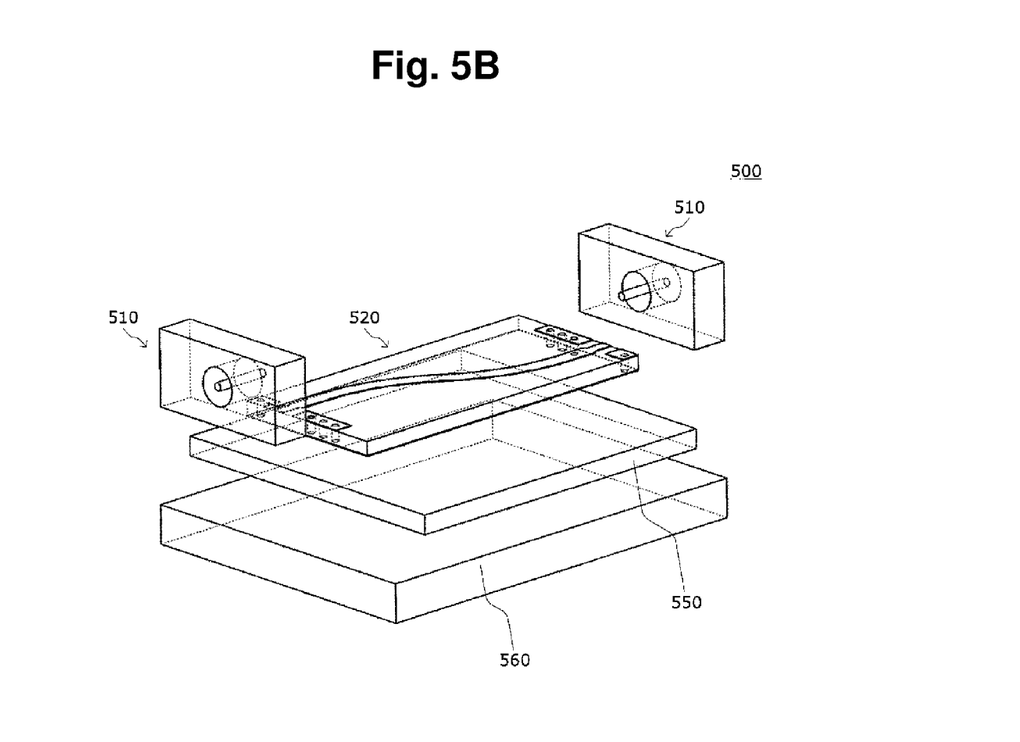
FIG. 5B is an exploded view of the conventional high-frequency line connection structure.
Figure 5C:
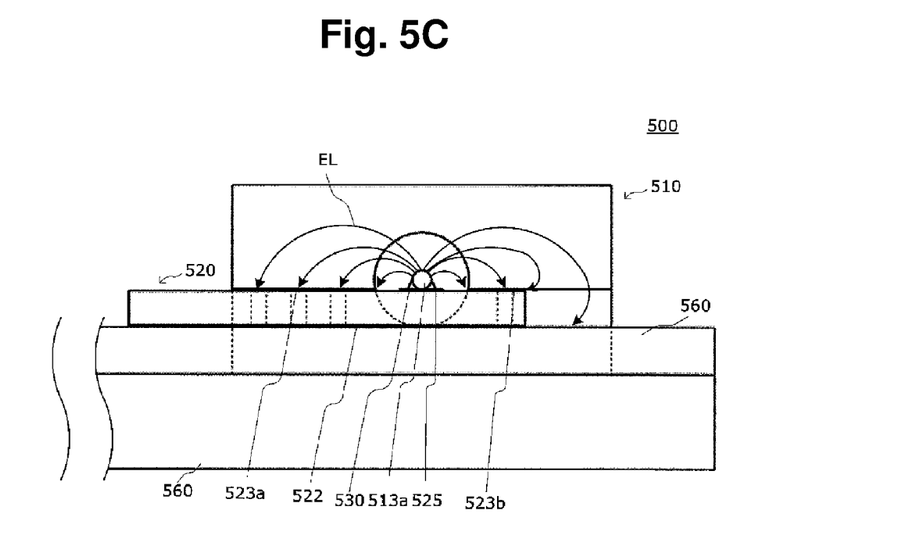
FIG. 5C is a front view of the conventional high-frequency line connection structure.

FIGS. 5A to 5C show a different conventional high-frequency line connection structure 500. The high-frequency line connection structure 500 connects a coaxial line 510 and a planar line 520. The planar line 520 is mounted on a surface of a conductive base 550, and is disposed on a surface of a metal base 560 integrally with the coaxial line 510.

With the conventional high-frequency line connection structure 500 shown in FIGS. 5A to 5C, a line end of a signal line 525 of the planar line 520 is provided at a position shifted from a center line of a substrate 521 along a lengthwise direction, and widths of ground conductive films 523a, 523b formed on respective sides of the signal line 525 are different from each other.

The coaxial line 510 includes an outer conductor 511, a cylindrical ground 512, and an inner conductor 513. A leading end portion 513a of the inner conductor 513 is formed to protrude in an axial direction at an end portion of the coaxial line 510 on the side of the planar line 520. The leading end portion 513a of the inner conductor 513 is electrically connected to the signal line 525 of the planar line 520, which is a connection destination, by solder, conductive adhesive or the like.

The planar line 520 that is connected to the coaxial line 510 has a grounded coplanar line structure at a connection portion. The planar line 520 includes the substrate 521 formed of dielectric, and the signal line 525 formed on a surface of the substrate 521. Furthermore, a back-surface ground conductive film 522 is formed on a back surface of the substrate 521 to cover an entire surface.

Two ground conductive films 523a, 523b are formed at an end portion that is the connection portion of the planar line 520, the two ground conductive films 523a, 523b being separate from the signal line 525 by a predetermined distance. Furthermore, ground vias 524 penetrating the substrate 521 are formed to electrically connect the two ground conductive films 523a, 523b and the back-surface ground conductive film 522.

The position on the planar line 520 where the coaxial line 510 is connected is shifted from a center axis of the substrate 521 along the lengthwise direction. This is because installation positions of components that are to be connected to a side of the coaxial line 510, opposite the planar line 520 side are determined in advance. In the conventional example shown in FIGS. 5A to 5C, the shape of the signal line 525 of the planar line 520 is a so-called S-bend shape.

Accordingly, the two ground conductive films 523a, 523b formed on the planar line 520 have different sizes. Widths a', b' of the two ground conductive films 523a, 523b along a widthwise direction of the substrate 521 are different from each other, and the width b' of the ground conductive film 523b is smaller than the width a' of the ground conductive film 523a.

A greater number of planar lines 520 may be fabricated by making a size of the substrate 521 compact. Accordingly, it is common with a high-frequency line with an S-bend shape to include the ground conductive films 523a, 523b that are asymmetrical along the signal line 525 as described above and that have different widths.

However, with the shapes of the ground conductive films 523a, 523b having asymmetrical widths relative to the signal line 525, it is relatively difficult to achieve desirable high-frequency characteristics for the conventional high-frequency line connection structure 500.

FIG. 5C is a schematic diagram of the high-frequency line connection structure 500 seen along a direction perpendicular to an axial direction of the coaxial line 510. FIG. 5C schematically shows electric field lines EL at 15 GHz.

As shown in FIG. 5C, the electric field lines EL extending from the leading end portion 513a of the inner conductor 513 of the coaxial line 510 are left-right asymmetrical with the inner conductor 513 at the center. This is due to the ground conductive films 523a, 523b having different widths a', b'. On the other hand, a shape of electric field lines extending from the inner conductor 513 inside the coaxial line 510 are axially symmetrical, extending from a surface of the inner conductor 513 to a surface of the cylindrical ground 512. This axial symmetry is constantly obtained regardless of the frequency.

When symmetry of the electric field lines at the connection portion between the coaxial line 510 and the planar line 520 is broken in this manner, desirable high-frequency characteristics are not achieved at the connection portion of the conventional high-frequency line connection structure 500, and a resulting increase in a return loss is considered as a problem.

Figure 6:
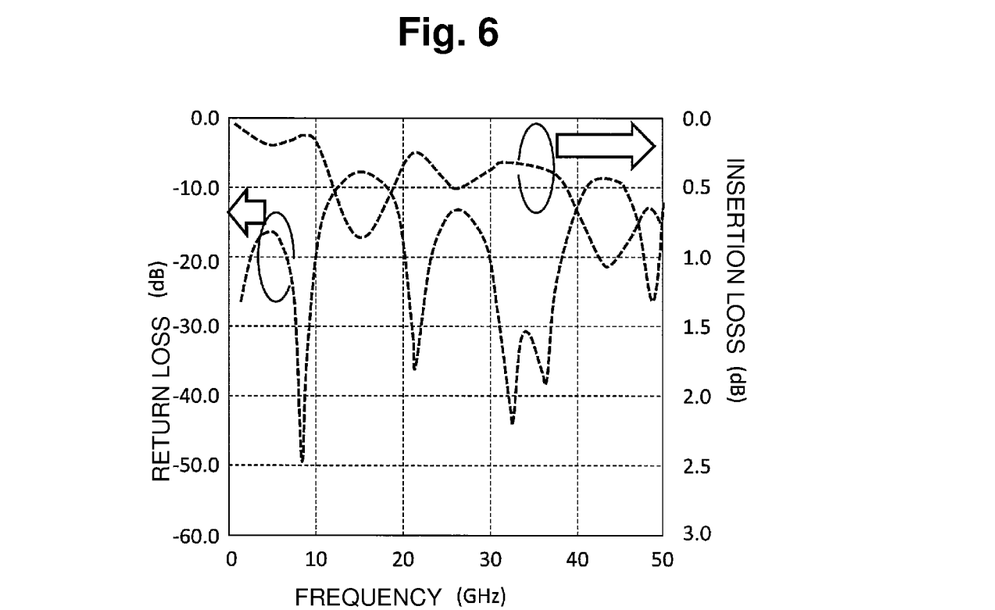
FIG. 6 is a diagram for describing a return loss and an insertion loss of the conventional high-frequency line connection structure.

FIG. 6 is a diagram for describing an insertion loss and a return loss of the conventional high-frequency line connection structure 500. As described above, the conventional high-frequency line connection structure 500 cannot achieve a desirable connection property at the connection portion between the coaxial line 510 and the planar line 520, and thus, reflection and resonance occur at both ends of the planar line 520 in the lengthwise direction. Accordingly, it can be seen in FIG. 6 that characteristics are degraded at a frequency of 15 GHz.

CITATION LIST

Patent Literature

Patent Literature 1: Japanese Patent No. 5235612

SUMMARY

Technical Problem

Embodiments of the present invention have been made to solve the problems described above, and has its object to provide a high-frequency line connection structure having low insertion loss characteristics and a low return loss.

Means for Solving the Problem

To solve the problems described above, a high-frequency line connection structure according to embodiments of the present invention is a high-frequency line connection structure for connecting a coaxial line and a planar line, wherein the coaxial line includes an inner conductor extending in an axial direction, the inner conductor having a cross-section formed into a circular shape around an axis, the cross-section being perpendicular to the axial direction, an outer conductor including a through hole for housing the inner conductor, the through hole having a columnar shape, and an insulation layer for insulating between the inner conductor and the outer conductor, the insulation layer being provided in the through hole between the inner conductor and the outer conductor, the inner conductor includes a leading end portion extending in the axial direction from an end surface of the outer conductor, the planar line includes a substrate that is formed of dielectric, a signal line having a strip-shape, a line end of the signal line being formed on a surface of the substrate, at a position that is separate by a predetermined distance from a center line of the substrate along a lengthwise direction, a pair of first conductive thin films that are formed in regions, which are on the surface of the substrate and adjacent to the coaxial line, the pair of first conductive thin films being formed on respective sides of the signal line across a predetermined distance, widths of the pair of first conductive thin films along a widthwise direction of the substrate being different from each other, and a second conductive thin film that covers a back surface of the substrate, the second conductive thin film being electrically connected to the pair of first conductive thin films, and the high-frequency line connection structure includes a conductive base that is formed into a planar shape having a length that matches a length of the planar line along the lengthwise direction of the substrate, where the planar line is disposed on a surface of the conductive base, a protrusion structure provided in a region, which is on the surface of the conductive base and adjacent to the coaxial line, the protrusion structure protruding from the surface of the conductive base, and an adhesion layer that is conductive and that is formed to cover the leading end portion of the inner conductor and the line end of the signal line included in the planar line, wherein the protrusion structure is in contact with a side surface of a region along the lengthwise direction of the substrate, where a first conductive thin film with a smaller width out of the pair of first conductive thin films is formed, the width being along the widthwise direction of the substrate, and a total of widths of the first conductive thin film with a smaller width and the protrusion structure, along the widthwise direction of the substrate, matches a width of a remaining first conductive thin film.

Furthermore, with the high-frequency line connection structure according to embodiments of the present invention, each of the pair of first conductive thin films may be formed into a rectangular shape in a plan view, and in the plan view, an area of the remaining first conductive thin film may match a total area of the first conductive thin film with a smaller width and the protrusion structure.

Furthermore, with the high-frequency line connection structure according to embodiments of the present invention, the protrusion structure may have a cuboid shape.

Furthermore, with the high-frequency line connection structure according to the present invention, the protrusion structure may include a sloped side that connects, in a front view, an end portion of the first conductive thin film with a smaller width and the conductive base.

Furthermore, with the high-frequency line connection structure according to embodiments of the present invention, the coaxial line may be connected, one each to each of both ends of the planar line, the signal line may be curved in an S shape in a plan view, and one line end and another line end may be provided at positions that are separate from each other across the center line of the substrate in the lengthwise direction, the pair of first conductive thin films may be formed on respective sides of each of the one line end and the other line end across the predetermined distance, and the protrusion structure may be provided in each region on the surface of the conductive base, the region being adjacent to the coaxial line.

Furthermore, with the high-frequency line connection structure according to embodiments of the present invention, the protrusion structure may be formed from a conductive material.

Effects of Embodiments of the Invention

According to embodiments of the present invention, a planar line is disposed on a surface of a conductive base where a protrusion structure protruding from a surface is disposed, and a line end of a coaxial line and a line end of the planar line are mechanically and electrically connected,

DETAILED DESCRIPTION OF ILLUSTRATIVE EMBODIMENTS

Hereinafter, preferred embodiments of the present invention will be described in detail with reference to FIG. 1A to FIG. 4C. Structural elements common among the drawings are denoted by same reference signs.

First Embodiment

Figure 1A:
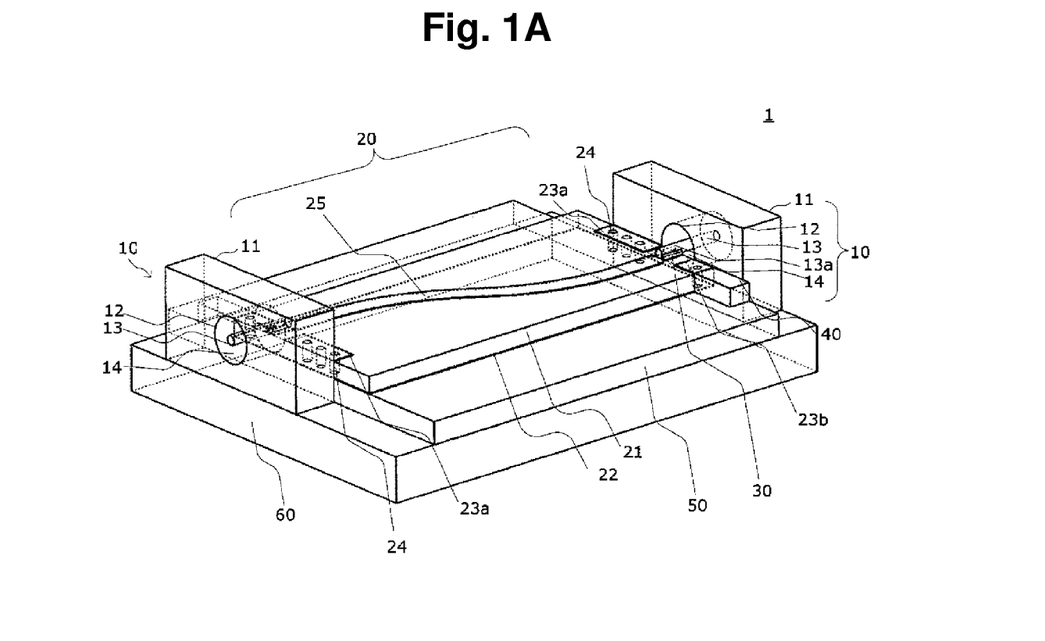
FIG. 1A is a perspective view of a high-frequency line connection structure according to a first embodiment of the present invention.
Figure 1B:
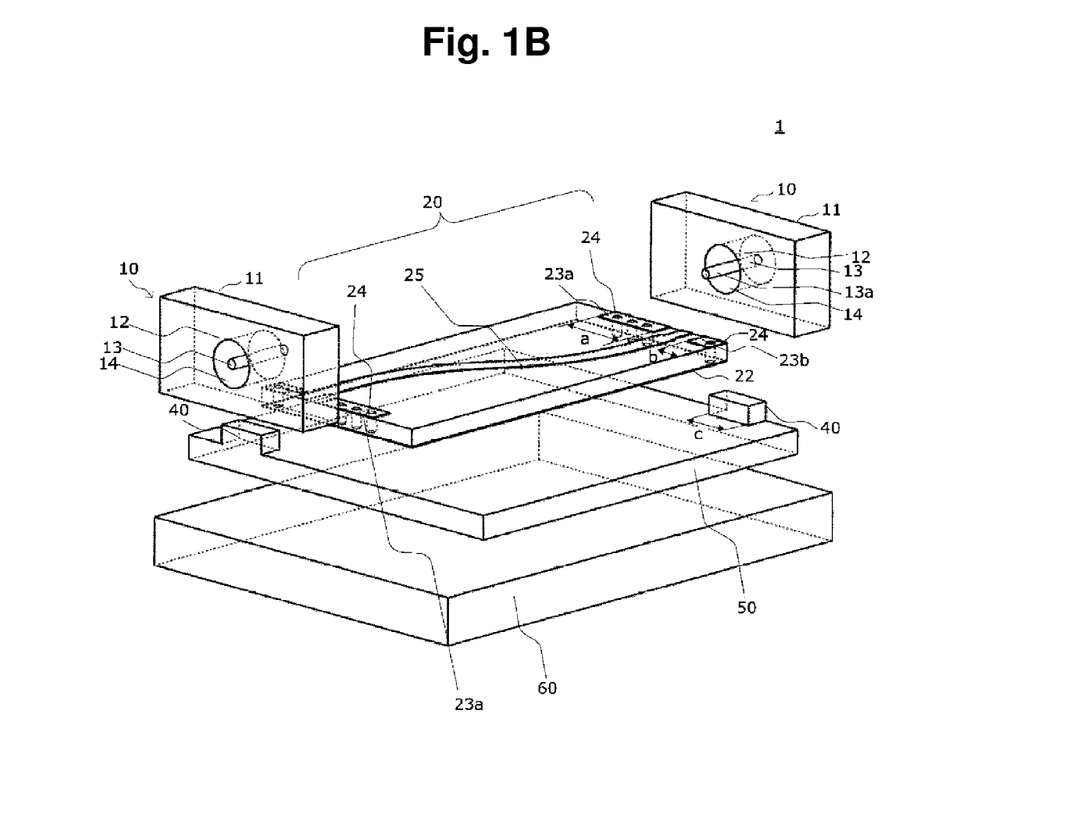
FIG. 1B is an exploded view of the high-frequency line connection structure according to the first embodiment.

FIG. 1A is a perspective view of a high-frequency line connection structure 1 according to a first embodiment. FIG. 1B is an exploded view of the high-frequency line connection structure 1. Furthermore, FIG. 1C is a front view of the high-frequency line connection structure 1.

Figure 1C:
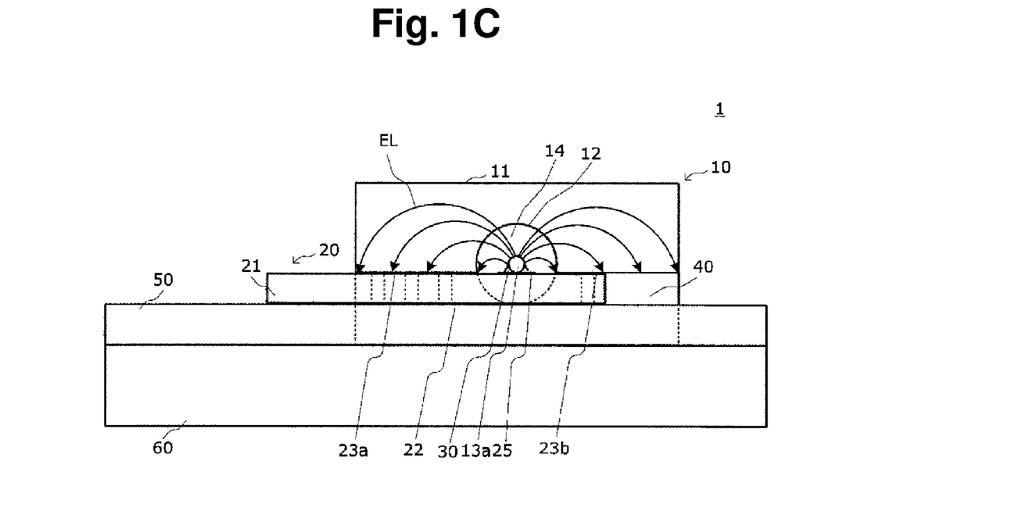
FIG. 1C is a front view of the high-frequency line connection structure according to the first embodiment.

As shown in FIGS. 1A to 1C, coaxial lines 10 and a planar line 20 are disposed on a cuboid metal base 60, and are connected to each other. Furthermore, outer conductors 11 of the coaxial lines 10 are disposed on one surface of the metal base 60, and the planar line 20 is disposed on the same surface of the metal base 60 across a conductive base 50 provided with protrusion structures 40.

Moreover, in the present embodiment, two coaxial lines 10 are connected to respective line ends of the planar line 20.

The high-frequency line connection structure 1 according to the present embodiment includes the coaxial lines 10, the planar line 20, an adhesion layer 30, the protrusion structures 40, the conductive base 50, and the metal base 60.

The coaxial line 10 includes the outer conductor 11, an inner wall 12 of the outer conductor 11, an inner conductor 13, and an insulation layer 14. The outer conductor 11, the inner wall 12 of the outer conductor 11, and the inner conductor 13 are formed to have a coaxial structure.

The outer conductor 11 is formed to have a block shape, and includes, on the inside, a columnar through hole that extends in an axial direction. The outer conductor 11 houses the inner conductor 13 in the columnar through hole. The outer conductor 11 is formed from a metal material. As shown in FIGS. 1A and 1B, the columnar through hole formed in the outer conductor 11 is formed coaxially with the inner conductor 13.

The inner wall 12 is an inner peripheral surface at the columnar through hole formed in the outer conductor 11, and is formed into a cylindrical shape.

A cross-section of the inner conductor 13 that is perpendicular to the axial direction is formed to have a circular shape around the axis. The inner conductor 13 is a signal core wire of the coaxial line 10 formed by including the inner wall 12 of the outer conductor 11 and the insulation layer 14.

As shown in FIGS. 1A and 1B, the inner conductor 13 includes a leading end portion 13a extending in the axial direction from an end surface of the block-shaped outer conductor 11. The leading end portion 13a of the inner conductor 13 is electrically connected to a signal line 25 provided on a surface of the planar line 20 by the adhesion layer 30. The inner conductor 13 is formed from a metal material.

The insulation layer 14 is provided in the through hole, between the inner conductor 13 and the outer conductor 11, and insulates between the inner conductor 13 and the outer conductor 11.

Next, a description will be given of the planar line 20 to which the coaxial line 10 is connected.

The planar line 20 is on an extension of the coaxial line 10 that is formed from the outer conductor 11, the inner wall 12, the inner conductor 13, and the insulation layer 14.

The planar line 20 includes a substrate 21, a back-surface ground conductive film (second conductive thin film) 22, pairs of ground conductive films (first conductive thin films) 23a, 23b, vias 24, and the signal line 25.

The planar line 20 is provided on a surface of the conductive base 50. The planar line 20 forms a well-known grounded coplanar line at a connection portion that is connected to the leading end portion 13a of the inner conductor 13 of the coaxial line 10.

The substrate 21 is a planar substrate formed of dielectric. For example, the substrate 21 may be formed of low-loss ceramics such as alumina. The signal line 25 and the pair of ground conductive films 23a, 23b are formed on a surface of the substrate 21, the pair of ground conductive films 23a, 23b being formed on respective sides of the signal line 25 across a predetermined distance. Moreover, the back-surface ground conductive film 22 is disposed on a back surface of the substrate 21.

The back-surface ground conductive film 22 is formed covering the entire back surface of the substrate 21. The back-surface ground conductive film 22 is disposed in contact with the surface of the conductive base 50. The back-surface ground conductive film 22 serves as a ground of the planar line 20 of a grounded coplanar line type.

The ground conductive films 23a, 23b are formed in regions, on the surface of the substrate 21, which are adjacent to the coaxial line 10, on respective sides of the signal line 25 across a predetermined distance. The ground conductive films 23a, 23b have different widths along a widthwise direction of the substrate 21. More specifically, a width b of the ground conductive film 23b along the widthwise direction of the substrate 21 is smaller than a width a of the ground conductive film 23a.

The predetermined distance of the pair of ground conductive films 23a, 23b from the signal line 25 may be designed such that characteristic impedance of the planar line 20 takes a predetermined value.

As shown in FIGS. 1A and 1B, in the present embodiment, the ground conductive films 23a, 23b are formed on both ends of the substrate 21 in the lengthwise direction. Accordingly, the grounded coplanar line is formed at each of two connection portions of the high-frequency line connection structure 1.

A plurality of vias 24 are formed penetrating the substrate 21 from the surface to the back surface. More specifically, a conductive material is vapor-deposited or filled on inner wall surfaces of the vias 24, and the vias 24 electrically connect and provide electrical continuity between the pair of ground conductive films 23a, 23b formed on the surface of the substrate 21 and the back-surface ground conductive film 22. Because the plurality of vias 24 are formed, the ground conductive films 23a, 23b become more stable equipotential surfaces.

The vias 24 are formed along the widthwise direction of the substrate 21, in regions where the ground conductive films 23a, 23b are formed and with predetermined spaces therebetween. An appropriate space may be selected as the space between the plurality of vias 24, taking into account the characteristics of transmission lines of the high-frequency line connection structure 1.

The signal line 25 is formed into a strip shape, with line ends being on the surface of the substrate 21, at positions separate by a predetermined distance from a center line of the substrate 21 along the lengthwise direction, and the signal line 25 propagates high-frequency signals. The signal line 25 is formed from a metal material. One end of the signal line 25 that is adjacent to the coaxial line 10 is electrically connected to the leading end portion 13a of the inner conductor 13 of the coaxial line 10.

The signal line 25 is curved in an S shape in a plan view. Furthermore, one line end and the other line end of the signal line 25 are provided at positions that are separate from each other across the center line of the substrate 21 along the lengthwise direction.

As shown in FIG. 1A, the adhesion layer 30 is formed covering the leading end portion 13a of the inner conductor 13 of the coaxial line 10 and a part of a surface of the signal line 25 of the planar line 20. The adhesion layer 30 is conductive, and mechanically and electrically connects the coaxial line 10 and the planar line 20. Solder, conductive adhesive or the like may be used as the adhesion layer 30.

The protrusion structure 40 is provided on the surface of the conductive base 50 described later, in a region adjacent to the coaxial line 10, and protrudes from the surface of the conductive base 50. The protrusion structure 40 is formed into a cuboid shape. The protrusion structure 40 is in contact with a side surface of the substrate 21 along the lengthwise direction where the ground conductive film 23b, which is the one with a smaller width between the pair of ground conductive films 23a, 23b, is formed, and a width combining the width b of the ground conductive film 23b and a width c of the protrusion structure 40 is equal to (matches) the width a of the remaining ground conductive film 23a.

The protrusion structure 40 is fabricated by processing the surface of the conductive base 50, and may be formed from a same conductive material as that of the conductive base 50.

For example, the cuboid shape of the protrusion structure 40 may have the width c and a height that is the same as a height of the substrate 21, and a depth may be the same as a length of the ground conductive film 23a in a widthwise direction. When the protrusion structure 40 having such a shape is disposed on the surface of the conductive base 50, accurate positioning may be performed at the time of disposing the planar line 20 on the surface of the conductive base 50.

The conductive base 50 is formed into a planar shape having a length that matches the length of the substrate 21 in the lengthwise direction, and the protrusion structure 40 is disposed on the surface of the conductive base 50. The planar line 20 is disposed on the surface of the conductive base 50.

A width of the conductive base 50 along an end surface on the coaxial line 10 side may be formed to be greater than a width of the substrate 21 of the planar line 20 along the widthwise direction.

The back-surface ground conductive film 22 formed on the back surface of the substrate 21 is disposed in a manner contacting a partial region of the surface of the conductive base 50. At this time, the planar line 20 is disposed on the surface of the conductive base 50 in such a manner that a side surface of a corner portion of the substrate 21 on the side of the ground conductive film 23b formed on the surface of the substrate 21 is in contact with a side surface of the protrusion structure 40. Accordingly, an end surface, on the coaxial line 10 side, including the planar line 20, the protrusion structure 40 and the conductive base 50 is formed into one planar surface that coincides with an end surface of the outer conductor 11 of the coaxial line 10.

The metal base 60 is provided on a back surface of the conductive base 50, and entirely supports the coaxial line 10 and the planar line 20. The high-frequency line connection structure 1 is integrally formed by the metal base 60. A surface of the metal base 60 is electrically connected to the metal base 60 and the outer conductor 11 of the coaxial line 10 by solder, conductive adhesive or the like (not shown).

Exactly the same potential, or in other words, a ground potential, is thereby achieved for the outer conductor 11 of the coaxial line 10 and the back-surface ground conductive film 22 of the planar line 20.

FIG. 1C schematically shows electric field lines EL at a frequency of 15 GHz, where the high-frequency line connection structure 1 is seen from front. It can be seen in FIG. 1C that, because the protrusion structure 40 described above is provided, the electric field lines EL extending from the leading end portion 13a of the inner conductor 13 of the coaxial line 10 become symmetrical along a straight line that passes through the inner conductor 13 and that is perpendicular to the signal line 25.

Additionally, the electric field lines inside the coaxial line 10 are axially symmetrical along the inner conductor 13, extending from a surface of the inner conductor 13 to an inner peripheral surface of the inner wall 12. A symmetrical structure of the electric field lines inside the coaxial line 10 is a symmetrical structure at all times, regardless of a frequency of electromagnetic waves to be propagated.

Figure 2:
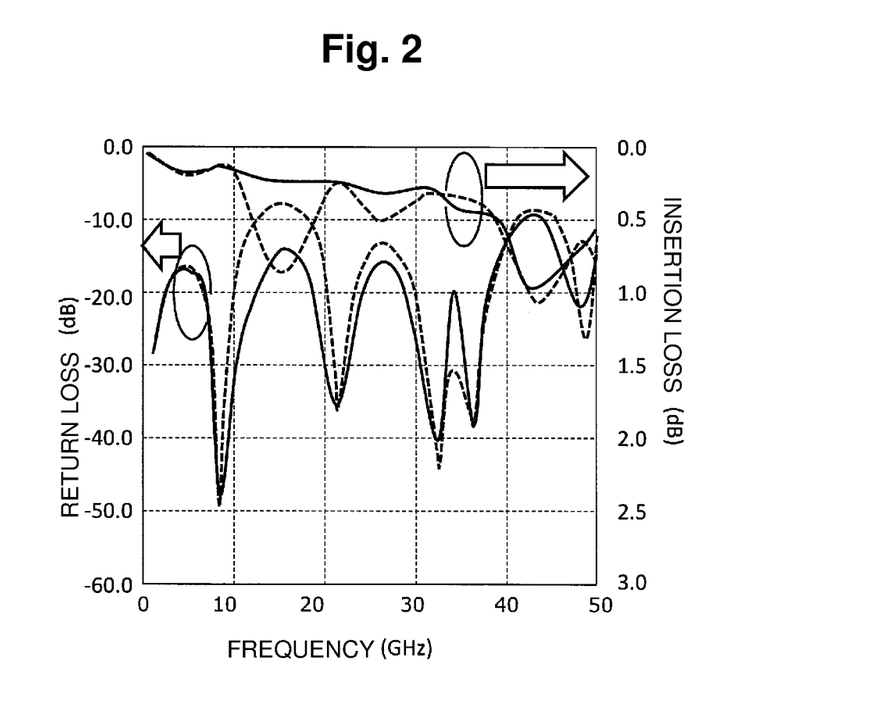
FIG. 2 is a diagram for describing an effect of the first embodiment.

FIG. 2 shows an insertion loss and a return loss of the high-frequency line connection structure 1 according to the present embodiment. Broken lines in FIG. 2 indicate an insertion loss and a return loss of the high-frequency line connection structure 500 of the conventional example (FIG. 6). Furthermore, solid lines indicate characteristics of the high-frequency line connection structure 1 according to the present embodiment. As can be seen in FIG. 2, with the high-frequency line connection structure 1, symmetry of the electric field lines at the connection portion may be obtained by including the protrusion structure 40, and thus, desirable high-frequency characteristics may be achieved, and as a result, the high-frequency line connection structure 1 with a low return loss is achieved.

As described above, according to the first embodiment, the leading end portion 13a of the inner conductor 13 of the coaxial line 10 and an end portion of the signal line 25 of the planar line 20 are more accurately positioned and mechanically and electrically connected thanks to the protrusion structure 40 provided on the surface of the conductive base 50. Accordingly, the width a of the ground conductive film 23a on the substrate 21 forming the grounded coplanar line at the planar line 20 may be made equal to the width combining the width b of the ground conductive film 23b and the width c of the protrusion structure 40. Therefore, the high-frequency line connection structure 1 having low insertion loss characteristics and a low return loss may be achieved.

Furthermore, because the high-frequency line connection structure 1 having sufficient high-frequency characteristics is achieved, electronic components and optical module components having next-generation broadband characteristics of 1 Tbps and beyond may be provided.

Second Embodiment

Next, a description will be given of a second embodiment of the present invention. Additionally, in the following description, structures the same as those in the first embodiment described above will be denoted by same reference signs, and description thereof will be omitted.

The first embodiment describes a case where the cuboid protrusion structure 40 is provided on the surface of the conductive base 50. In contrast, a protrusion structure 40A provided in a high-frequency line connection structure 1A according to the second embodiment has a fillet structure. The high-frequency line connection structure 1A is configured in the same manner as in the first embodiment except for the protrusion structure 40A. In the following, the structure different from that in the first embodiment will be mainly described.

Figure 3A:
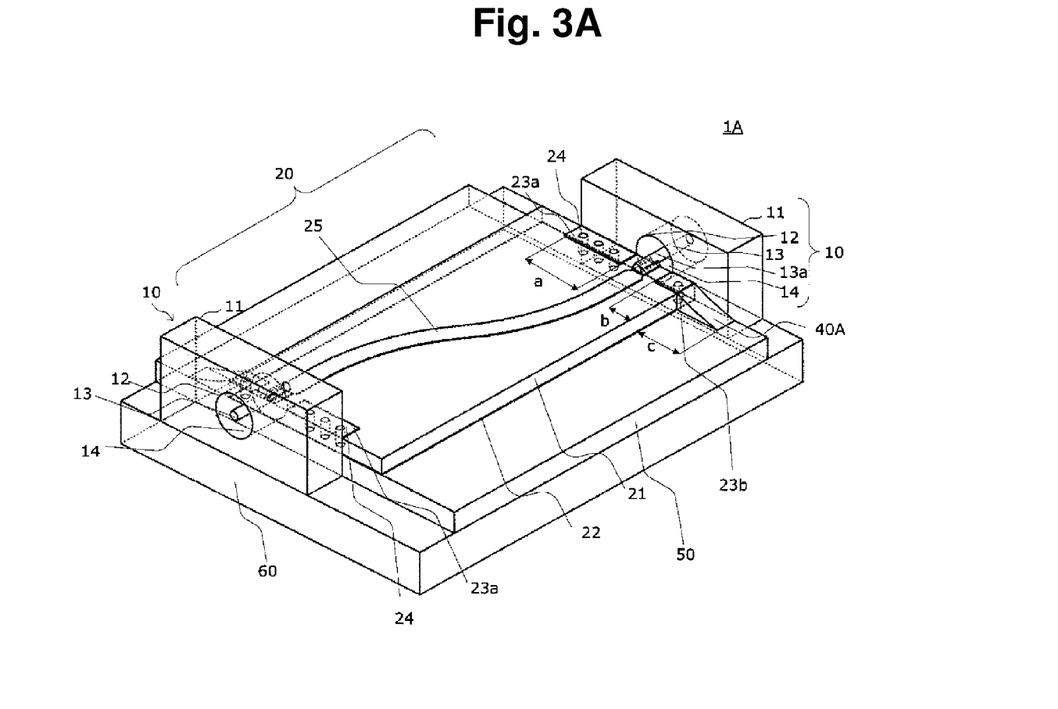
FIG. 3A is a perspective view of a high-frequency line connection structure according to a second embodiment of the present invention.
Figure 3B:
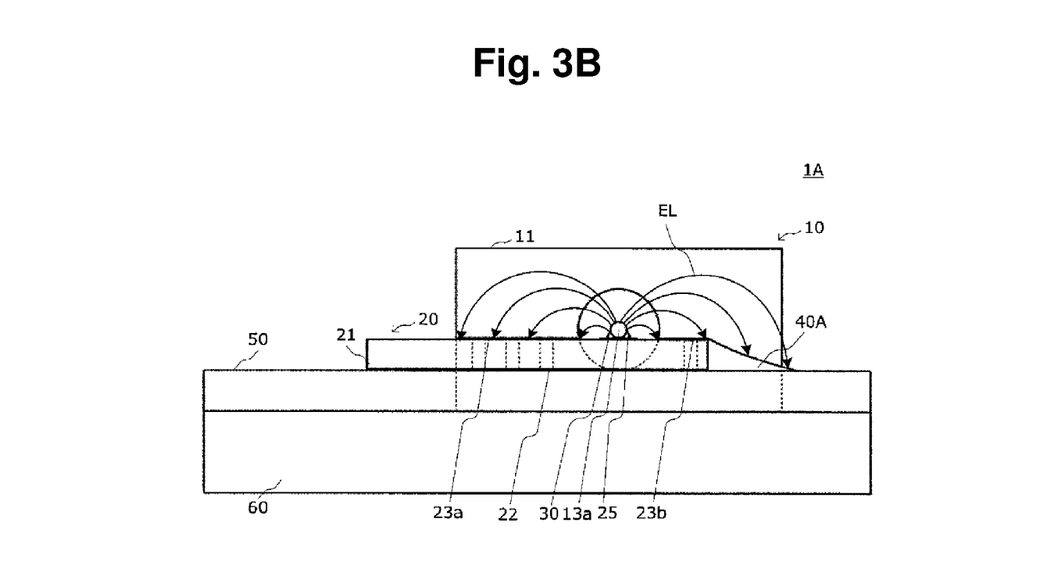
FIG. 3B is a front view of the high-frequency line connection structure according to the second embodiment of the present invention.

FIG. 3A is a perspective view of the high-frequency line connection structure 1A according to the second embodiment. FIG. 3B is a front view of the high-frequency line connection structure 1A.

Furthermore, the protrusion structure 40A is formed into a rectangular shape in a plan view, and is formed such that a total of a length c of a long side and the width b of the ground conductive film 23b is equal to the width a of the ground conductive film 23a.

The protrusion structure 40A is formed by conductive adhesive, solder or the like. As shown in FIG. 3B, the protrusion structure 40A includes a sloped side that connects, in a front view, an end portion of the ground conductive film 23b having a smaller width and the conductive base 50.

More specifically, as shown in FIG. 3B, the protrusion structure 40A is, when seen from front, formed into a fillet shape of a gentle recessed curve that is in contact with a side surface of the substrate 21 and the surface of the conductive base 50 that are adjacent to each other. The protrusion structure 40A may be formed after the substrate 21 is disposed on the surface of the conductive base 50. When such a protrusion structure 40A is formed, the substrate 21 is fixed to the conductive base 50.

FIG. 3B schematically shows the electric field lines EL at a frequency of 15 GHz, where the high-frequency line connection structure 1A is seen from front. Because the high-frequency line connection structure 1A includes the protrusion structure 40A having a fillet shape, the electric field lines EL extending from the leading end portion 13a of the inner conductor 13 of the coaxial line 10 become symmetrical along a straight line that passes through the inner conductor 13 and that is perpendicular to the signal line 25.

Additionally, as in the first embodiment, the electric field lines inside the coaxial line 10 are axially symmetrical along the inner conducting wire 13 of the coaxial line 10, regardless of a frequency of electromagnetic waves to be propagated.

Figure 4A:
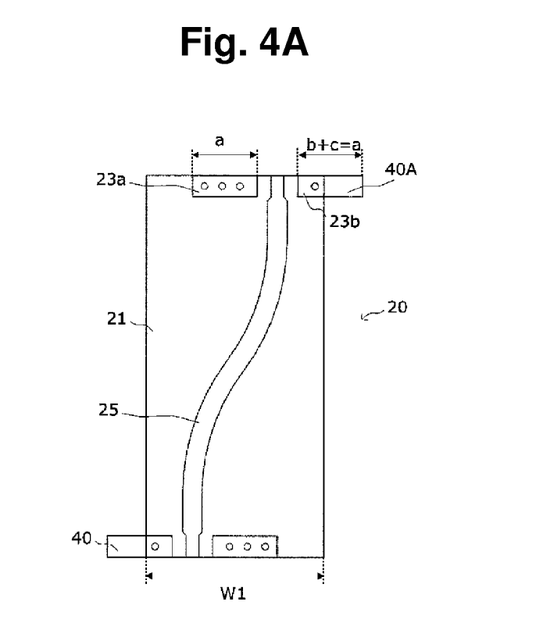
FIG. 4A is a plan view of a planar line according to the second embodiment.

FIG. 4A is a plan view selectively showing the planar line 20 and the protrusion structure 40A of the high-frequency line connection structure 1A. As shown in FIG. 4A, the width a of the ground conductive film 23a provided on the planar line 20, along the widthwise direction of the substrate 21, is equal to a width combining the width b of the remaining ground conductive film 23b and a width c of the protrusion structure 40A extending from the ground conductive film 23b in a direction away from the signal line 25.

Furthermore, as shown in FIG. 4A, an area of the ground conductive film 23a having a rectangular shape in a plan view and an area of the ground conductive film 23b and the protrusion structure 40A combined are the same.

Figure 4B:
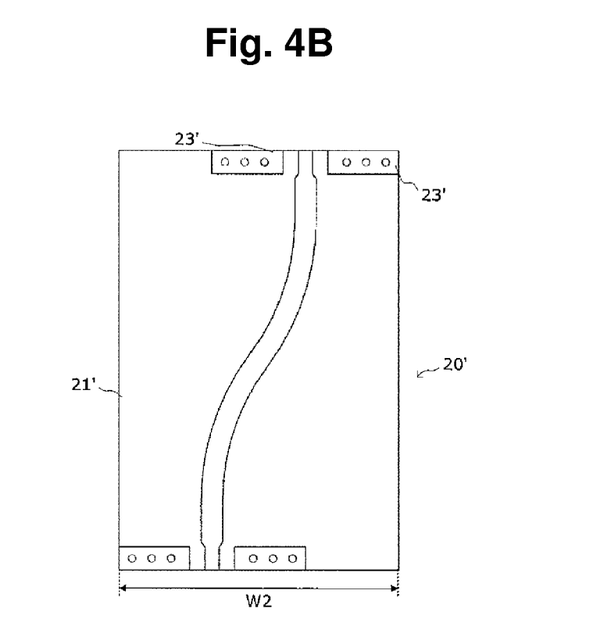
FIG. 4B is a diagram for describing the planar line shown in FIG. 4A.

Now, as shown in FIG. 4B, to achieve the same high-frequency characteristics as those of the high-frequency line connection structure 1A of the present embodiment by only a planar line 20', a pair of ground conductive films 23' that are symmetrical and that have a same width is necessary instead of the pair of ground conductive films 23a, 23b having asymmetrical shapes. Accordingly, a size of a substrate 21' of the planar line 20' shown in FIG. 4B has to be increased.

Figure 4C:
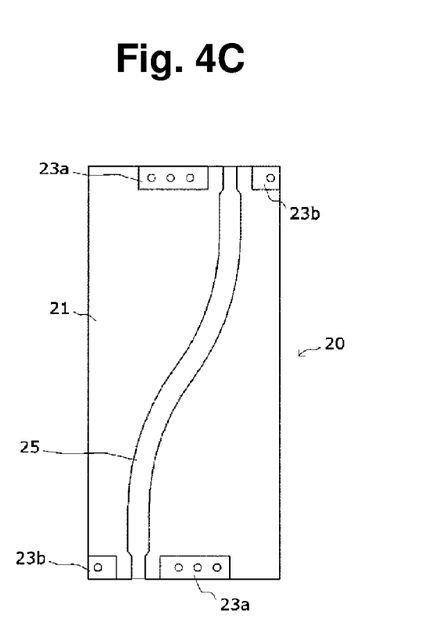
FIG. 4C is a plan view of the planar line according to the second embodiment.

FIG. 4C is a diagram showing the planar line 20 of the high-frequency line connection structure 1A according to the present embodiment, without the protrusion structure 40A. It can be clearly seen that a width W2 of the substrate 21' of a comparative example shown in FIG. 4B is greater than a width W1 of the substrate 21 according to the present embodiment shown in FIG. 4C. In this manner, with the high-frequency line connection structure 1A according to the present embodiment, the high-frequency characteristics may be improved while reducing the size of the substrate 21.

As described above, with the high-frequency line connection structure 1A according to the second embodiment, the protrusion structure 40A does not have to be accurately fabricated on the surface of the conductive base 50. With the high-frequency line connection structure 1A, it is suffice to dispose the planar line 20 on the surface of the conductive base 50, and to form the protrusion structure 40A having a fillet structure by solder or the like on a side surface of the substrate 21 on the ground conductive film 23b side and the surface of the substrate 21 that is adjacent to the side surface. Accordingly, a low return loss and low insertion loss characteristics over a wide band may be achieved for the high-frequency line connection structure 1A by using the protrusion structure 40A that is fabricated with greater ease.

Heretofore, embodiments of the high-frequency line connection structure of the embodiments of present invention have been described, but the present invention is not limited to the embodiments described, and may be modified in various ways conceivable to those skilled in the art within the scope of the invention described in the claims.

Additionally, in the embodiments described above, the substrate 21 forming the grounded coplanar line (planar line 20) is low-loss ceramics such as alumina, but liquid crystal polymer, polyimide, quartz glass or the like may also be used as the substrate 21.

Furthermore, in the embodiments described above, at the time of electrically connecting the coaxial line 10 and the grounded coplanar line (planar line 20) by the adhesion layer 30, such as solder, gold plating is generally applied to the connection portions of the lines to improve wettability of the solder. However, gold plating is not an essential feature of embodiments of the present invention, and description thereof is omitted.

REFERENCE SIGNS LIST 1, 1A high-frequency line connection structure
10 coaxial line
11 outer conductor
12 inner wall
13 inner conductor
13a leading end portion
14 insulation layer
20 planar line
21 substrate
22 back-surface ground conductive film
23a, 23b ground conductive film
24 via
25 signal line
30 adhesion layer
40 protrusion structure
50 conductive base
60 metal base.

The invention claimed is:

1. A high-frequency line connection structure for connecting a coaxial line and a planar line, the high-frequency line connection structure comprising:
   a conductive base having a planar shape having a length that matches a length of the planar line along a lengthwise direction of a substrate, wherein the planar line is disposed on a surface of the conductive base;
   a protrusion structure on the surface of the conductive base and adjacent to the coaxial line, wherein the protrusion structure protrudes from the surface of the conductive base; and
   a conductive adhesion layer covering a leading end portion of an inner conductor of the coaxial line and a line end of a signal line included comprised in the planar line,
   wherein the protrusion structure is in contact with a side surface of a region along the lengthwise direction of the substrate, wherein a first conductive thin film has a smaller width of a pair of conductive thin films, a width of the first conductive thin film being along a widthwise direction of the substrate, and a combined width of the first conductive thin film and the protrusion structure matches a width of a second conductive thin film of the pair of conductive thin films;
   wherein the coaxial line comprises:
      the inner conductor extending in an axial direction, the inner conductor having a circular cross-section around an axis, the circular cross-section being perpendicular to the axial direction;
      an outer conductor including a through hole for housing the inner conductor, the through hole having a columnar shape; and
      an insulation layer between the inner conductor and the outer conductor, the insulation layer being disposed in the through hole between the inner conductor and the outer conductor;
   wherein the inner conductor includes the leading end portion extending in the axial direction from an end surface of the outer conductor; and
   wherein the planar line comprises:
      the substrate that is formed of dielectric,
      the signal line having a strip-shape, the line end of the signal line being on a surface of the substrate at a position that is separate by a predetermined distance from a center line of the substrate along a lengthwise direction;
      the pair of conductive thin films being on the surface of the substrate and adjacent to the coaxial line, the pair of conductive thin films being disposed on respective sides of the signal line across a predetermined distance; and
      a third conductive thin film that covers a back surface of the substrate, the third conductive thin film being electrically connected to the pair of conductive thin films.

2. The high-frequency line connection structure according to claim 1, wherein:
   each of the pair of conductive thin films has a rectangular shape in a plan view; and
   in the plan view, an area of the second conductive thin film matches with a total area of the first conductive thin film and the protrusion structure.

3. The high-frequency line connection structure according to claim 1, wherein the protrusion structure has a cuboid shape.

4. The high-frequency line connection structure according to claim 1, wherein the protrusion structure includes a sloped side that connects an end portion of the first conductive thin film and the conductive base.

5. The high-frequency line connection structure according to claim 1, wherein:
   the coaxial line is connected to both ends of the planar line;
   the signal line is curved in an S shape in a plan view, and a first line end and a second line end of the signal line are provided at positions that are separate from each other across the center line of the substrate in the lengthwise direction;
   the pair of conductive thin films is on respective sides of each of the first line end and the second line end across the predetermined distance; and
   the protrusion structure is adjacent to the coaxial line.

6. The high-frequency line connection structure according to claim 1, wherein the protrusion structure is formed from a conductive material.

7. A method comprising:
   connecting, a coaxial line and a planar line with a high-frequency connection structure;
   wherein the high-frequency line connection structure comprises:
      a conductive base having a planar shape having a length that matches a length of the planar line along a lengthwise direction of a substrate, wherein the planar line is disposed on a surface of the conductive base;
      a protrusion structure on the surface of the conductive base and adjacent to the coaxial line, wherein the protrusion structure protrudes from the surface of the conductive base; and a conductive adhesion layer covering a leading end portion of an inner conductor of the coaxial line and a line end of a signal line included comprised in the planar line, wherein the protrusion structure is in contact with a side surface of a region along the lengthwise direction of the substrate, wherein a first conductive thin film has a smaller width of a pair of conductive thin films, a width of the first conductive thin film being along a widthwise direction of the substrate, and a combined width of the first conductive thin film and the protrusion structure matches a width of a second conductive thin film of the pair of conductive thin films;

wherein the coaxial line comprises:
   the inner conductor extending in an axial direction, the inner conductor having a circular cross-section around an axis, the circular cross-section being perpendicular to the axial direction;
   an outer conductor including a through hole for housing the inner conductor, the through hole having a columnar shape; and
   an insulation layer between the inner conductor and the outer conductor, the insulation layer being disposed in the through hole between the inner conductor and the outer conductor;

wherein the inner conductor includes the leading end portion extending in the axial direction from an end surface of the outer conductor; and wherein the planar line comprises:
   the substrate that is formed of dielectric,
   the signal line having a strip-shape, the line end of the signal line being on a surface of the substrate at a position that is separate by a predetermined distance from a center line of the substrate along a lengthwise direction;
   the pair of conductive thin films being on the surface of the substrate and adjacent to the coaxial line, the pair of conductive thin films being disposed on respective sides of the signal line across a predetermined distance; and
   a third conductive thin film that covers a back surface of the substrate, the third conductive thin film being electrically connected to the pair of conductive thin films.

8. The method of claim 7, wherein:
each of the pair of conductive thin films has a rectangular shape in a plan view; and
in the plan view, an area of the second conductive thin film matches with a total area of the first conductive thin film and the protrusion structure.

9. The method of claim 7, wherein:
wherein the protrusion structure has a cuboid shape.

10. The method of claim 7, wherein:
wherein the protrusion structure includes a sloped side that connects an end portion of the first conductive thin film and the conductive base.

11. The method of claim 7, wherein:
the coaxial line is connected to both ends of the planar line;
the signal line is curved in an S shape in a plan view, and a first line end and a second line end of the signal line are provided at positions that are separate from each other across the center line of the substrate in the lengthwise direction;
the pair of conductive thin films is on respective sides of each of the first line end and the second line end across the predetermined distance; and
the protrusion structure is adjacent to the coaxial line.

12. The method of claim 7, wherein the protrusion structure is formed from a conductive material.

* * * * *